(12) United States Patent
Robert et al.

(10) Patent No.: US 6,756,855 B2
(45) Date of Patent: Jun. 29, 2004

(54) MULTI-FREQUENCY DIELECTRIC RESONATOR OSCILLATOR

(75) Inventors: Jean-Luc Robert, Betton (FR); Jean-Yves Le Naour, Pace (FR); Philippe Minard, Rennes (FR)

(73) Assignee: Thomson Licensing S.A., Boulogne (FR)

(*) Notice: Subject to any disclaimer, the term of this patent is extended or adjusted under 35 U.S.C. 154(b) by 0 days.

(21) Appl. No.: 10/161,894

(22) Filed: Jun. 4, 2002

(65) Prior Publication Data

US 2002/0186093 A1 Dec. 12, 2002

(30) Foreign Application Priority Data

Jun. 7, 2001 (FR) .............................. 01 07581

(51) Int. Cl.[7] .............................................. H03B 11/10

(52) U.S. Cl. ........................... 331/107 DP; 331/107 SL

(58) Field of Search ....................... 331/109 R, 107 DP, 331/107 P, 107 SL, 117 D, 117 FE, 96, 99, 177 V

(56) References Cited

U.S. PATENT DOCUMENTS

| | | | |
|---|---|---|---|
| 4,733,199 A | | 3/1988 | Khanna ........................ 331/99 |
| 6,069,543 A | * | 5/2000 | Ishikawa et al. .......... 333/219.1 |
| 6,344,779 B1 | * | 2/2002 | Haruta et al. ................. 331/96 |
| 6,538,536 B1 | * | 3/2003 | Seely et al. .................. 333/235 |

OTHER PUBLICATIONS

French Search Report of Oct. 10, 2001.

* cited by examiner

*Primary Examiner*—Timothy P. Callahan
*Assistant Examiner*—Cassandra Cox
(74) *Attorney, Agent, or Firm*—Joseph S. Tripoli; Kuniyuki Akiyama

(57) ABSTRACT

The invention provides a dielectric resonator oscillator DR, especially for transmission devices whose oscillating frequency may take several values. The oscillator uses two interfering conductors 30 and 31 switched so that they may or may not form a metal plane close to the dielectric resonator DR in order to vary the frequency of the oscillator while using a single resonator. The interfering conductors 30 and 31 are located in the cavity CAV close to the resonator DR and the switching means may or may not establish an electrical contact between the said interfering conductors 30 and 31.

8 Claims, 3 Drawing Sheets

MULTI-FREQUENCY DIELECTRIC RESONATOR OSCILLATOR

The invention relates to a multi-frequency dielectric resonator oscillator, and more particularly to oscillators operating at microwave frequencies.

BACKGROUND OF THE INVENTION

Microwave oscillators are used in transmission systems and more particularly close to the antenna in order to carry out a frequency transposition between an intermediate frequency band and a transmission frequency band. The frequency transposition is due to the use of two units, one generally located inside a building while the other is located outside, close to the antenna. The internal and external units are linked by means of an electrical conductor, for example a coaxial cable, which leads to high losses at the transmission frequencies used, for example greater than 10 GHz.

Communication systems use increasingly high transmission frequencies and increasingly wide frequency bands. A single frequency transposition involves using a band which is as wide for the intermediate frequencies as for the transmission frequency. However, the use of an intermediate frequency bandwidth greater than a GHz has implementation problems. This is because the losses in the coaxial cable which connects the internal and external units vary significantly over the intermediate bandwidth. Moreover, it is expensive to produce a frequency synthesizer which is able to provide the agility in terms of frequency needed to scan very wide intermediate frequency bands.

In order to obtain an intermediate frequency band which is narrower than the transmission band, it is possible to segment the transmission band before transposing it. Such a segmentation may be carried out by using several switched oscillators in the external unit. Depending on the oscillator selected, the intermediate frequency band receives only part of the transmission band, the said part corresponding to the frequency selected.

Dielectric resonator oscillators are commonly used in external transmission system units. Dielectric resonators are generally used in a feedback loop, for example as shown in one of FIG. 1A or 1B. The coupling between the dielectric resonator DR and the electrical circuit is produced by bringing a dielectric resonator DR and conductor CL of the electrical circuit close together, the conductor being, for example, a microstrip line. The positioning of the dielectric resonator will have a direct effect on the degree of coupling, the output power of the oscillator, the frequency stability and also the oscillator frequency.

The oscillation frequency of a dielectric resonator oscillator depends on its dimensions and on the electromagnetic properties of its environment. To control these factors, the resonator is placed in a screened cavity through which the conductor passes. FIG. 2 illustrates an embodiment of this sort in which a microstrip line CL passes through a screened cavity CAV inside which there is a dielectric resonator DR. The resonator DR is held in the cavity CAV by spacers (not shown). For further details on producing dielectric resonator oscillators, a person skilled in the art may refer to the book entitled "*Dielectric Resonators*", 2nd edition, by Darko Kajfez and Pierre Guillon, published in 1998 by Noble Publishing Corporation.

A known solution for obtaining several frequencies from dielectric resonator oscillators is to use several oscillators and to switch their outputs. The increase in the number of oscillators leads to an increase in the size of the circuits placed in the external unit.

BRIEF SUMMARY OF THE INVENTION

The aim of the invention is to reduce the size of external units using several transposition frequencies. For this, the invention provides a dielectric resonator oscillator whose oscillation frequency may take several values. The device of the invention uses switched interfering conductors close to the dielectric resonator in order to vary the frequency of the oscillator while using a single resonator, the interfering conductors behaving either as two separate conductors or as a metal plane.

The invention is an oscillator circuit comprising a dielectric resonator located close to a coupling conductor providing the coupling with the rest of the oscillator circuit, the said resonator and the said coupling conductor being located in a cavity. The oscillating circuit comprises at least one pair of interfering conductors located in the cavity close to the resonator. Switching means may or may not establish an electrical contact between the interfering conductors.

The invention will be better understood, and other particular features and advantages will become apparent on reading the following description, the description referring to the appended drawings among which:

DETAILED DESCRIPTION OF PREFERRED EMBODIMENTS

Figures 1A, 1B:
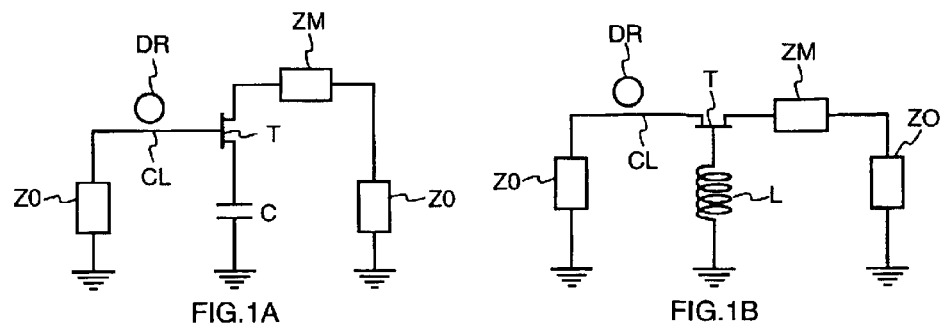
FIGS. 1A and 1B show circuit diagrams of dielectric resonator oscillators.
Figure 2:
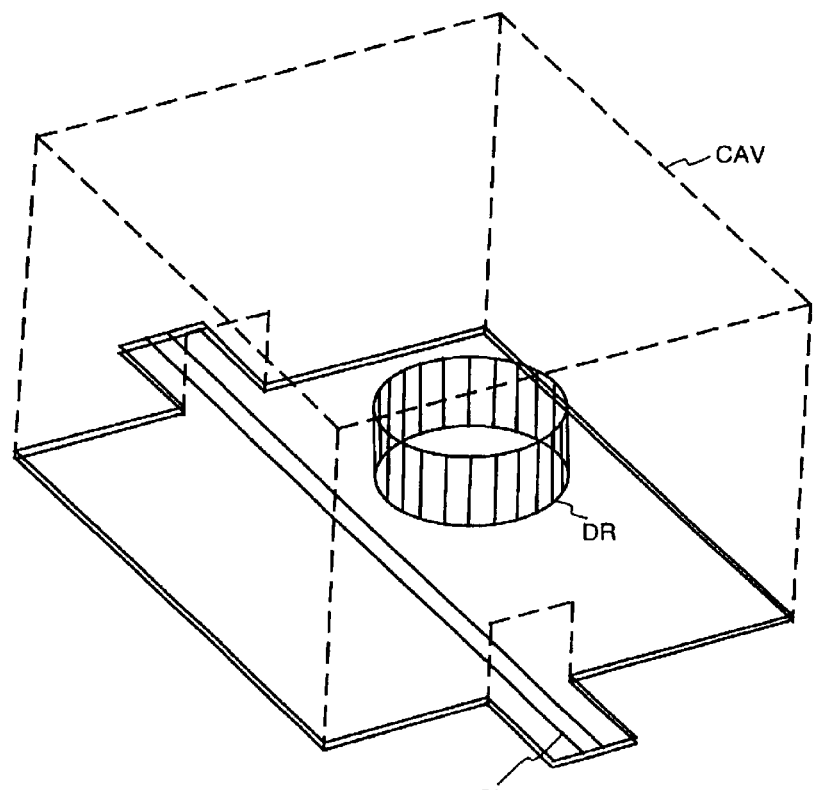
FIG. 2 shows the assembly of a resonator according to the prior art.

As indicated above, FIGS. 1A and 1B show dielectric resonator oscillator circuits. These electrical oscillator circuits can be used with the invention and with other known circuits in which the frequency of the oscillator is determined only by the resonator DR and its environment.

Figure 3:
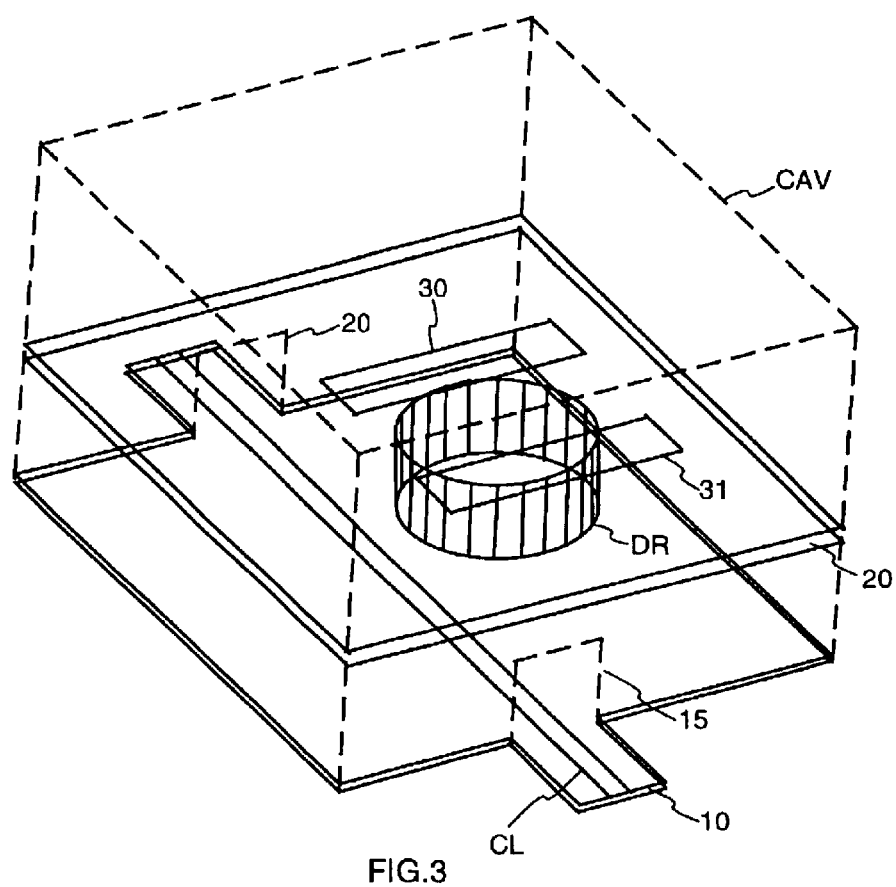
FIGS. 3 to 5 detail the assembly of a dielectric resonator from different views and aspects according to the invention.
Figure 4:
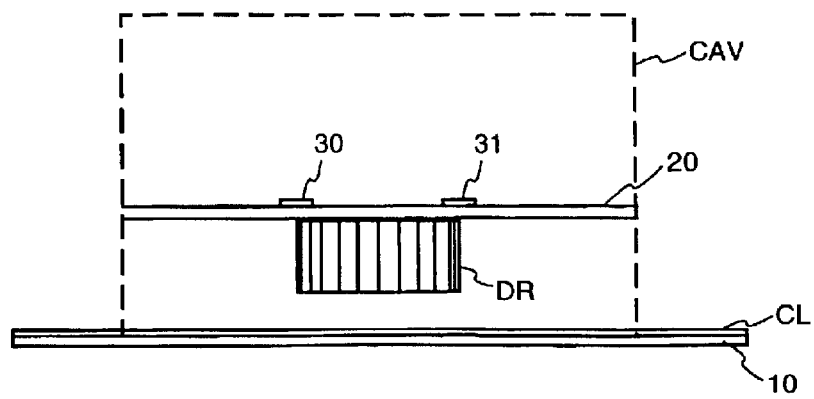

FIG. 3 shows in perspective the assembly of the dielectric resonator DR close to the conducting line CL of the oscillator circuit of one of FIG. 1A or 1B. FIG. 4 shows a side view of this assembly.

A screened cavity CAV surrounds the resonator DR in order to insulate it from external electromagnetic interference. The cavity CAV consists, for example, of a metal cover connected to earth. A substrate 10 closes the screened cavity CAV. The substrate 10 comprises, on the face located inside the cavity CAV, the conductor CL, for example made using a microstrip line. On the face of the substrate 10 located outside the cavity, an earth plane provides electromagnetic sealing. Orifices 15 placed on either side of the cavity CAV allow the conductor CL to pass through. The substrate 10 is extended beyond the cavity and supports the rest of the oscillator circuit.

A second substrate 20 is held, for example by adhesive bonding, inside the cavity CAV. The resonator DR is adhesively bonded onto one face of the second substrate 20. The resonator DR is positioned on the second substrate 20 and the second substrate 20 is positioned in the cavity CAV in order to ensure coupling between the resonator DR and the conductor CL according to a known technique.

The second substrate 20 comprises, on the face opposite the resonator, two interfering conductors 30 and 31. The interfering conductors 30 and 31 are, for example, produced using printed lines. In order to prevent parasitic coupling between the interfering conductors 30 and 31 and the conductor CL, the interfering conductors 30 and 31 are preferably oriented along planes perpendicular to the conductor CL. The magnetic field lines of the resonator DR, at the second substrate 20, are preferably perpendicular to the said substrate.

Figure 5:
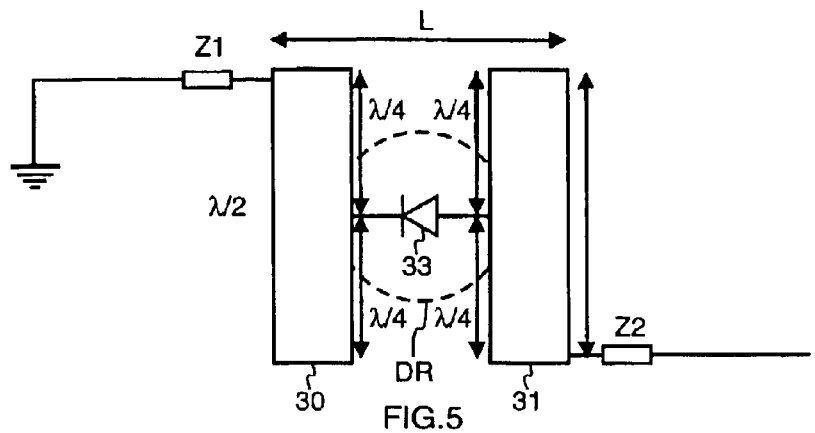

FIG. 5 shows the operational aspect of the invention. The interfering conductors 30 and 31 are placed symmetrically above the resonator DR. The length of the interfering conductors is substantially equal to half the wavelength of the lowest frequency that it is desired to obtain, the wavelength taking into account the medium propagating the wave, which is the substrate in the example described. The resonator DR should be centered with respect to the interfering conductors 30 and 31. The interfering conductors 30 and 31 are placed on either side of the resonator DR so as not to cover most of the area of the resonator DR. Moreover, the combination of the interfering conductors 30 and 31 defines an area greater in size than the area of the resonator DR.

The interfering conductor 30 is connected to earth via a matching impedance Z1. The interfering conductor 31 is connected to a control line via a matching impedance Z2. The matching impedances Z1 and Z2 behave as low-pass filters which are equivalent to short circuits at low frequency and to open circuits in the frequency ranges of the oscillator produced. The interfering conductors 30 and 31 are connected together, preferably at their middle, via a diode 33, for example of the PIN type. The control line may take two states corresponding to a first and a second control state. The impedances Z1 and Z2, the diode 33 and the control line form a switching circuit which is placed on the second substrate 20.

In a first control state, the control line is at a potential such that the diode 33 is switched off. In this first control state, the interfering conductors 30 and 31 are electrically independent. The magnetic field propagates through the second substrate up to the upper surface of the cavity. The coupling of the magnetic field developed by the resonator DR is then a maximum between the interfering conductors 30 and 31. The oscillation frequency corresponds to a low operating frequency whose value depends on the length and on the width of the interfering conductors, on the space between the interfering conductors and on the size of the cavity.

In a second control state, the control line is at a positive voltage which is enough for the diode 33 to become conducting. The diode 33 is switched on and the interfering conductors 30 and 31 are electrically connected. The two interfering conductors 30 and 31 then behave as an interfering metal plane of width L. The interfering metal plane switches off the magnetic field of the resonator DR at a virtually zero distance corresponding to the thickness of the substrate. The oscillation frequency corresponds to the maximum frequency of the resonator DR. The potential between the interfering conductors 30 and 31 corresponds to the threshold voltage of the diode 33, however, at the oscillation frequencies, variations in potential are the same on both interfering conductors.

By way of example, the coupling of a dielectric resonator of nominal frequency 9.9 GHz with interfering conductors made using microstrip lines of length 9.1 mm, of width 3.5 mm and spaced apart by a distance of 2.5 mm enables a low frequency of 9 GHz and a high frequency of 10.9 GHz to be obtained.

In order to obtain different frequencies with the same resonator, it is possible to move away the plane in which the interfering conductors are located in order to decrease the upper frequency. It is also possible to dimension the interfering conductors differently in order to vary the low frequency.

Figure 6:
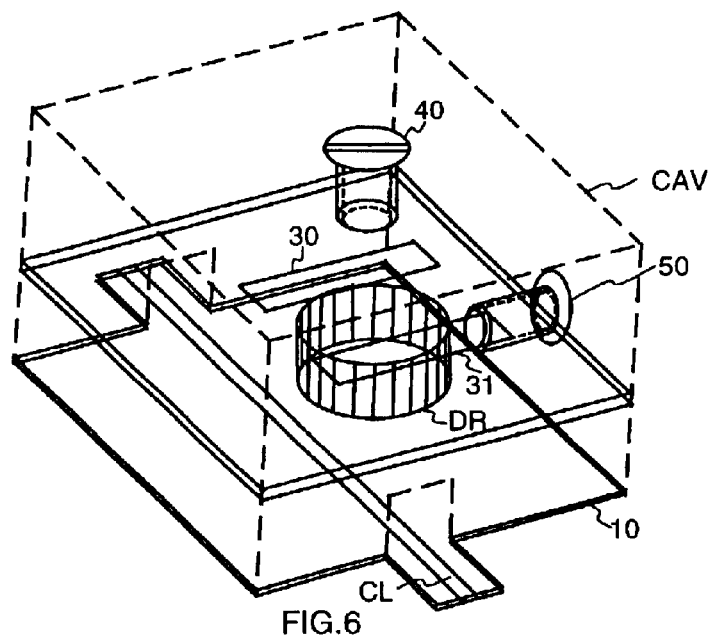
FIG. 6 shows an improvement to the assembly of FIGS. 3 to 5.

To reduce the design and dimensioning constraints of the device of the invention, it is possible to resort to adjusting screws. FIG. 6 shows one possible way of positioning screws enabling the upper and lower frequencies to be adjusted. A first screw 40 passes through the cavity CAV in the upper part along the magnetic axis of the resonator DR. A second screw 50 passes through the cavity on a side wall perpendicular to the magnetic axis of the resonator DR, the resonator DR being along the axis of the screw. The first and second screws provide for independent adjustment of the high frequency and of the low frequency.

In the second control state, the interfering conductors 30 and 31 form a metal plane above the resonator DR. The first screw 40 is ineffective. The high frequency can be adjusted using the second screw 50.

In the first control state, the interfering conductors 30 and 31 allow the magnetic field to pass up to the top of the cavity which forms a visible metal plane. The degree of insertion of the first screw disturbs the magnetic field, which enables the low frequency to be adjusted.

Figure 7:
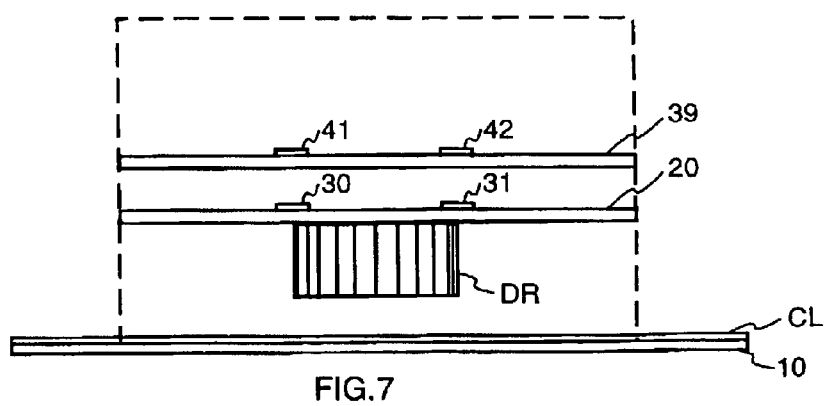
FIG. 7 shows a variant of the invention.

The invention also makes it possible to produce a switched oscillator which can supply more than two frequencies. FIG. 7 shows an embodiment in which a third substrate 39 is placed above the second substrate 20. The third substrate 39 comprises two interfering conductors 41 and 42 and a switching circuit similar to that shown in FIG. 5. The interfering conductors 41 and 42 are parallel to the interfering conductors 30 and 31. The conductor 41, placed above the interfering conductor 30, is connected to earth. Depending on the various control states of the switching circuits, there are three operational possibilities.

According to a first state, the interfering conductors 30 and 31 form a first metal plane which corresponds to a high operating frequency. This state is independent of the conductors 41 and 42.

According to a second state, the conductors 30 and 31 are not electrically connected and the conductors 41 and 42 form a metal plane at a different distance from the resonator DR. This state corresponds to an intermediate operating frequency.

According to a third state, the conductors 30, 31, 41 and 42 are rendered independent. This state corresponds to a low operating frequency.

The addition of other substrates supporting other interfering conductors enables other operating frequencies to be obtained. For n substrates, n+1 operating frequencies are obtained.

Other embodiments are possible.

The above embodiments describe a substrate 20 which supports, on the one hand the resonator DR and, on the other hand, the conductors 30 and 31 produced using lines printed in copper. This is a simple and effective solution. However, it is possible to fasten the resonator using spacers other than the substrate. It is also possible to resort to conductors other than the printed lines held in the cavity by whatever means. Similarly, it is not necessary for the conductors 30 and 31 to be placed in a plane perpendicular to the magnetic field lines coming out of the resonator DR. The switching of two linear conductors which may or may not create a metal plane makes it possible to have two different operating frequencies. The proposed embodiment turns out to be the simplest solution to implement.

Similarly, FIG. 5 shows the interfering conductors with the switching circuit. This circuit is matched depending on the diode and on the control voltages which it is desired to use. The low-frequency behaviour of the impedances may be equivalent to a bias resistance acting to limit the current. Also, it has been chosen to connect Z1 to earth, which enables the diode to be switched off with a control voltage close to zero volts. It goes without saying that other choices are possible. More generally, any other type of switching circuit can be used provided it enables the two interfering conductors to be electrically connected at least for the high frequencies.

In the embodiment described, the cavity CAV is closed by the substrate 10 which is covered with an earth plane and which supports the conductor CL. As a variant, it is possible to use a closed metal cavity through which a conducting wire simply passes.

In the present description, the cavity is of rectangular shape. It goes without saying that other cavity shapes can be used, in particular cylindrical cavities.

What is claimed is:

1. Oscillator circuit comprising a dielectric resonator located close to a coupling conductor providing the coupling with the rest of the oscillator circuit, the said resonator and the said coupling conductor being located in a cavity, wherein said oscillator circuit comprises:
    at least one pair of interfering conductors located in the cavity close to the resonator,
    switching means which establishes or not an electrical contact between the interfering conductors.

2. Circuit according to claim 1, wherein the switching means comprise a diode placed between the interfering conductors.

3. Circuit according to claim 2, wherein the point of contact between the diode and each interfering conductor is located at the middle of each interfering conductor.

4. Circuit according to claim 1, wherein the length of the interfering conductors is substantially equal to half the wavelength of the lowest frequency which the oscillator circuit is able to provide.

5. Circuit according to claim 1, wherein it comprises a substrate having two opposite faces, the resonator being adhesively bonded onto one of the faces, and the interfering conductors being produced on the other face using printed lines.

6. Circuit according to claim 1, wherein the coupling conductor and the interfering conductors are rectilinear, and in that the interfering conductors are perpendicular to the coupling conductor.

7. Circuit according to claim 1, wherein it comprises a second pair of interfering conductors located in the cavity and second switching means in order to be able to switch the second pair of interfering conductors.

8. Circuit according to claim 2, wherein the interfering conductor are placed in a planed perpendicular to the magnetic field coming out of the dielectric resonator.

* * * * *